US011424153B2

(12) United States Patent
Yoon et al.

(10) Patent No.: US 11,424,153 B2
(45) Date of Patent: Aug. 23, 2022

(54) BACK GRINDING TAPE

(71) Applicant: LG CHEM, LTD., Seoul (KR)

(72) Inventors: Mi Seon Yoon, Daejeon (KR); Sera Kim, Daejeon (KR); Kwang Joo Lee, Daejeon (KR); Bora Yeon, Daejeon (KR); Sang Hwan Kim, Daejeon (KR); Eun Yeong Kim, Daejeon (KR)

(73) Assignee: LG CHEM, LTD., Seoul (KR)

( * ) Notice: Subject to any disclaimer, the term of this patent is extended or adjusted under 35 U.S.C. 154(b) by 104 days.

(21) Appl. No.: 16/964,364

(22) PCT Filed: Jun. 4, 2019

(86) PCT No.: PCT/KR2019/006708
§ 371 (c)(1),
(2) Date: Jul. 23, 2020

(87) PCT Pub. No.: WO2019/235805
PCT Pub. Date: Dec. 12, 2019

(65) Prior Publication Data
US 2021/0035847 A1    Feb. 4, 2021

(30) Foreign Application Priority Data

Jun. 4, 2018 (KR) .................. 10-2018-0064315

(51) Int. Cl.
H01L 21/683 (2006.01)
H01L 21/304 (2006.01)
C09J 7/29 (2018.01)
B32B 27/36 (2006.01)
B32B 7/14 (2006.01)

(52) U.S. Cl.
CPC ............ H01L 21/6836 (2013.01); C09J 7/29 (2018.01); H01L 21/304 (2013.01); C09J 2433/00 (2013.01); C09J 2475/00 (2013.01); H01L 2221/68327 (2013.01)

(58) Field of Classification Search
CPC ..... C09J 7/22; H01L 21/6836; H01L 21/6835
See application file for complete search history.

(56) References Cited

U.S. PATENT DOCUMENTS 9,905,450 B2    2/2018  Kim et al.
10,224,230 B2   3/2019  Tamura et al.
2005/0244631 A1* 11/2005 Sugimoto ........... H01L 21/6836
                                                      428/343
2005/0269717 A1  12/2005 Ohashi et al.
2011/0139347 A1   6/2011 Kim et al.
2012/0121881 A1   5/2012 Kim et al.
2014/0045319 A1   2/2014 Joo et al.
2014/0079947 A1   3/2014 Tamura et al.
2014/0295182 A1* 10/2014 Dong ........................ C09J 7/385
                                                      428/355 AC
2016/0326401 A1* 11/2016 Ikebata .................... C09J 7/405
2017/0025303 A1   1/2017 Morita et al.
2017/0290217 A1* 10/2017 Kim ................... H01L 21/6836
2018/0022971 A1*  1/2018 Fujita ......................... C09J 7/10
                                                      428/423.1
2018/0051197 A1*  2/2018 Wu .......................... C09J 175/16
2018/0312728 A1* 11/2018 Mori .......................... C09J 7/10

FOREIGN PATENT DOCUMENTS

| JP | 2005-343997 A    | 12/2005 |
| JP | 2012-191098 A    | 10/2012 |
| JP | 2012-530375 A    | 11/2012 |
| JP | 2017-110055 A    | 6/2017  |
| KR | 10-2006-0046354 A | 5/2006  |
| KR | 10-2009-0118881 A | 11/2009 |
| KR | 10-2010-0134529 A | 12/2010 |
| KR | 10-2011-0021276 A | 3/2011  |
| KR | 10-2012-0066685 A | 6/2012  |
| KR | 10-2017-0075712 A | 7/2017  |
| KR | 10-2017-0099695 A | 9/2017  |
| KR | 10-2017-0109390 A | 9/2017  |
| KR | 10-2018-0034699 A | 4/2018  |
| WO | 2005-105857 A1   | 11/2005 |
| WO | 2016-151911 A1   | 9/2016  |

OTHER PUBLICATIONS

International Search Report issued for International Application No. PCT/KR2019/006708 dated Sep. 24, 2019, 4 pages.
Extended European Search Report dated Jan. 20, 2021, of the corresponding European Patent Application No. 19814242.4, 9 pages.

* cited by examiner

Primary Examiner — Brian Turner
(74) Attorney, Agent, or Firm — Rothwell, Figg, Ernst & Manbeck, P.C.

(57) ABSTRACT

The present disclosure relates to a back grinding tape including a polymer resin layer including a urethane (meth)acrylate resin containing 10 to 40 wt % of a repeating unit derived from a (meth)acrylate monomer or oligomer having a glass transition temperature of 0° C. or higher, wherein the polymer resin layer has a glass transition temperature of −30° C. to 0° C. The present disclosure also relates to a method of grinding a wafer using the back grinding tape.

12 Claims, No Drawings

BACK GRINDING TAPE

CROSS-REFERENCE TO RELATED APPLICATION

This application is a 35 U.S.C. 371 National Phase Entry Application from PCT/KR2019/006708 filed on Jun. 4, 2019, designating the United States, which claims the benefits of Korean Patent Application No. 10-2018-0064315 filed on Jun. 4, 2018 with the Korean Intellectual Property Office, the disclosures of which are incorporated herein by references in their entirety.

TECHNICAL FIELD

The present disclosure relates to a back grinding tape, and more particularly, to a tacky tape which is attached to a surface of a semiconductor wafer for protecting the surface during a back grinding process in a semiconductor manufacturing process.

BACKGROUND OF THE INVENTION

Recently, as the tendency toward miniaturization, high functionalization, and capacity enlargement of electronic devices has been expanding, the need for densification and high integration of the semiconductor package has rapidly increased. Accordingly, the size of semiconductor chips becomes larger and the thickness becomes thinner at the same time, which increases the degree of integration of the circuit. However, a modulus of the semiconductor chip itself is lowered, causing problems in the manufacturing process or in the reliability of the final product.

A back grinding process is essentially carried out to facilitate assembly by grinding a back surface of a wafer with a polishing wheel composed of fine diamond particles to reduce the thickness of the chip in accordance with the demand for enlargement and thinning of the semiconductor. During the grinding process, damage to wafers such as contamination and cracks frequently occurs due to a large amount of silicon residue (dust) and particles. Therefore, the tacky film for protecting the surface of the semiconductor wafer or the back grinding tape becomes more important.

Particularly, when the semiconductor wafer is ground to an extremely thin thickness, rigidity of the wafer is lowered and warpage easily occurs, so that uniformity of physical properties of the back grinding tape used in the grinding process becomes more important.

BRIEF SUMMARY OF THE INVENTION

The present disclosure provides a back grinding tape which can be easily applied to a grinding process of a wafer having a thin thickness, and can exhibit improved wafer protecting performance.

The present disclosure also provides a grinding method of a wafer using the back grinding tape.

A back grinding tape is provided, including a polymer resin layer including a urethane (meth)acrylate resin containing 10 to 40 wt % of a repeating unit derived from a (meth)acrylate monomer or oligomer having a glass transition temperature of 0° C. or higher, wherein the polymer resin layer has a glass transition temperature of −30° C. to 0° C.

A method of grinding a wafer using the back grinding tape is also provided.

DETAILED DESCRIPTION OF THE INVENTION

Hereinafter, the back grinding tape and the grinding method according to the exemplary embodiments of the present disclosure will be described in more detail.

In the present disclosure, (meth)acrylate includes both acrylate and methacrylate.

As described above, according to an embodiment of the present disclosure, back grinding tape is provided, including a polymer resin layer including a urethane (meth)acrylate resin containing 10 to 40 wt % of a repeating unit derived from a (meth)acrylate monomer or oligomer having a glass transition temperature of 0° C. or higher, wherein the polymer resin layer has a glass transition temperature of −30° C. to 0° C.

The present inventors prepared a polymer resin layer having a glass transition temperature of −30° C. to 0° C. by using a urethane (meth)acrylate resin containing 10 to 40 wt % of a repeating unit derived from a (meth)acrylate monomer or oligomer having a glass transition temperature of 0° C. or higher, and found through experiments that when the polymer resin layer is used as a back grinding tape, it can be easily applied to a grinding process of a wafer having a thin thickness of about 50 μm. They also found that the back grinding tape has a recovery rate of less than a certain level, so that deformation by stress or heat during processing can be prevented, and thereby realizing improved wafer protecting performance, thereby completing the present invention.

More specifically, as the polymer resin layer has a glass transition temperature of −30° C. to 0° C., and includes a urethane (meth)acrylate resin containing 10 to 40 wt % of a repeating unit derived from a (meth)acrylate monomer or oligomer having a glass transition temperature of 0° C. or higher, an absolute value of a difference between the following recovery rate 1 and the following recovery rate 2 measured on the back grinding tape may be 10% or less.

[Recovery Rates 1 and 2]

The recovery rate 1 is a ratio of a length recovered to a length stretched when the back grinding film is stretched 5% in any direction (first direction) at room temperature.

The recovery rate 2 is a ratio of a length recovered to a length stretched when the back grinding film is stretched 5% in a second direction perpendicular to the first direction at room temperature.

When the absolute value of the difference between the recovery rate 1 and the recovery rate 2 exceeds 10%, a gap between chips (hereinafter referred to as kerf) expands or shrinks due to heat or stress generated during the grinding process, resulting in chip breakage or aligning problems, which may cause a process error. When the absolute value is below 10%, there is little deformation due to expansion or contraction, and the chip breakage or kerf shrinkage can be prevented, thereby achieving improved wafer protecting performance.

Herein, the absolute value of the difference between the recovery rate 1 and the recovery rate 2 may be 10% or less, 7% or less, or 5% or less.

The first direction may be a machine direction ("MD") of the polymer resin layer included in the back grinding tape, and the second direction may be a transverse direction ("TD") of the polymer resin layer.

The polymer resin layer may have a glass transition temperature of −30° C. to 0° C., because the resin layer includes a urethane (meth)acrylate resin containing 10 to 40 wt % of a repeating unit derived from a (meth)acrylate monomer or oligomer having a glass transition temperature of 0° C. or higher. More specifically, the (meth)acrylate monomer or oligomer having a glass transition temperature of 0° C. or higher may have a glass transition temperature of 0° C. to 100° C.

Examples of the (meth)acrylate monomer or oligomer having a glass transition temperature of 0° C. or higher may be at least one compound consisting of o-phenyl phenoxyethyl acrylate (OPPEA), isobornyl (meth)acrylate (IBOA), methyl acrylate, and cyclohexyl (meth)acrylate.

The urethane (meth)acrylate resin may further include a (meth)acrylate-based repeating unit containing a C2 to C12 alkyl group or a (meth)acrylate-based repeating unit containing a cross-linkable functional group together with the repeating unit derived from the (meth)acrylate monomer or oligomer having a glass transition temperature of 0° C. or higher.

The (meth)acrylate-based repeating unit containing a C2 to C12 alkyl group may be a repeating unit derived from at least one monomer or oligomer selected from the group consisting of pentyl (meth)acrylate, n-butyl (meth)acrylate, ethyl (meth)acrylate, hexyl (meth)acrylate, n-octyl (meth)acrylate, isooctyl (meth)acrylate, 2-ethylhexyl (meth)acrylate, dodecyl (meth)acrylate, and decyl (meth)acrylate.

Examples of the (meth)acrylate-based repeating unit containing a cross-linkable functional group may include a (meth)acrylate-based repeating unit containing a hydroxyl group, a carboxyl group, a nitrogen-containing functional group, or the like. The (meth)acrylate-based repeating unit containing a cross-linkable functional group may be derived from a (meth)acrylate-based monomer containing the cross-linkable functional group.

Examples of the hydroxyl group-containing (meth)acrylate monomer include 2-hydroxyethyl (meth)acrylate and 2-hydroxypropyl (meth)acrylate. Examples of the carboxyl group-containing (meth)acrylate monomer may include (meth)acrylic acid, and examples of the (meth)acrylate monomer containing a nitrogen-containing functional group may include (meth)acrylonitrile, N-vinyl pyrrolidone, and N-vinyl caprolactam. However, the examples are not limited thereto.

The urethane (meth)acrylate resin may include 10 to 40 wt % of a repeating unit derived from a (meth)acrylate monomer or oligomer having a glass transition temperature of 0° C. or higher, and may further include a segment or a urethane (meth)acrylate-based repeating unit derived from a urethane (meth)acrylate oligomer or polymer.

Examples of the urethane (meth)acrylate oligomer or polymer are not specifically limited. For example, a urethane (meth)acrylate-based oligomer having a molecular weight of 100 to 15,000, a polycarbonate-modified aliphatic urethane (meth)acrylate oligomer having a molecular weight of 100 to 15,000, or a polycarbonate urethane (meth)acrylate having a molecular weight of 20,000 to 100,000 may be used.

The thickness of the polymer resin layer is not particularly limited, but may be 5 μm to 200 μm.

In the meantime, the back grinding tape of the embodiment may further include a tacky layer having a thickness of 1 μm to 100 μm.

A specific composition of the tacky layer is not particularly limited. For example, the tacky layer may include a tacky resin, a photoinitiator, and a cross-linking agent.

The cross-linking agent may include at least one compound selected from the group consisting of an isocyanate-based compound, an aziridine-based compound, an epoxy-based compound, and a metallic chelate-based compound. The tacky layer may include 0.1 to 40 parts by weight of the cross-linking agent based on 100 parts by weight of the tacky resin. When the content of the cross-linking agent is too small, cohesiveness of the tacky layer may be insufficient. On the other hand, when the content of the cross-linking agent is too high, the tacky layer may not sufficiently secure adhesion before photo-curing, and a chip scattering phenomenon may occur.

Specific examples of the photoinitiator are not limited, but photoinitiators known in the art may be used. The tacky layer may include 0.1 to 20 parts by weight of the photoinitiator based on 100 parts by weight of the tacky resin.

The tacky resin may include a (meth)acrylate-based resin. In the present disclosure, the (meth)acrylate includes both acrylate and methacrylate.

Examples of the (meth)acrylate-based resin may include a copolymer of a (meth)acrylic acid ester-based monomer and a monomer containing a cross-linkable functional group. Herein, examples of the (meth)acrylic acid ester-based monomer may include alkyl (meth)acrylate, specifically monomers containing a C1 to C12 alkyl group, such as pentyl (meth)acrylate, n-butyl (meth)acrylate, ethyl (meth)acrylate, methyl (meth)acrylate, hexyl (meth)acrylate, n-octyl (meth)acrylate, isooctyl (meth)acrylate, 2-ethylhexyl (meth)acrylate, dodecyl (meth)acrylate, decyl (meth)acrylate, or a mixture thereof.

Examples of the monomer containing a cross-linkable functional group may include a hydroxyl group-containing monomer, a carboxyl group-containing monomer, a nitrogen-containing monomer, or a mixture thereof.

Examples of the hydroxyl group-containing compound may include 2-hydroxyethyl (meth)acrylate, 2-hydroxypropyl (meth)acrylate, 4-hydroxybutyl (meth)acrylate, 6-hydroxyhexyl (meth)acrylate, 8-hydroxyoctyl (meth)acrylate, 2-hydroxy ethylene glycol (meth)acrylate, 2-hydroxy propylene glycol (meth)acrylate, and the like.

Examples of the carboxyl group-containing compound may include (meth)acrylate, 2-(meth)acryloyloxy acetic acid, 3-(meth)acryloyloxy propyl acid, 4-(meth) acryloyloxy butyric acid, an acrylic acid dimer, itaconic acid, maleic acid, maleic anhydride, and the like.

Examples of the nitrogen-containing monomer may include (meth)acrylonitrile, N-vinyl pyrrolidone, N-vinyl caprolactam, and the like.

In the (meth)acrylate-based resin, vinyl acetate, styrene, acrylonitrile, and the like may be additionally included so as to improve other functionalities such as compatibility and the like.

The tacky layer may further include an UV curable compound.

The kind of the UV curable compound is not specifically limited, and for example, a multifunctional compound having a weight average molecular weight of 500 to 300,000 (e.g. a polyfunctional urethane acrylate, a polyfunctional acrylate monomer or oligomer, and the like) may be used. One of ordinary knowledge in the art could easily select appropriate compounds according to the desired use. The content of the UV curable compound may be 1 to 400 parts by weight, preferably 5 to 200 parts by weight, based on 100 parts by weight of the tacky resin. When the content of the UV curable compound is less than 1 part by weight, an adhesion decrease after curing may not be sufficient, and thus pick-up may be deteriorated. When it is greater than 400 parts by weight, cohesiveness of the adhesive before UV irradiation may be insufficient, or delamination from a release film or the like may not be easy.

The UV curable adhesive may be used not only in the form of the addition type of UV curable compound, but also in the form in which a carbon-carbon double bond is bonded to an acrylic copolymer at the end of side chain or main chain. That is, the (meth)acrylate-based copolymer may further include a UV curable compound bonded to the side chain of the main chain including the (meth)acrylic acid ester-based monomer and the monomer containing a cross-linkable functional group.

The type of the UV curable compound is not particularly limited as long as the compound includes 1 to 5, preferably 1 or 2, photo-curable functional groups (e.g., UV polymerizable carbon-carbon double bond) per molecule, and a functional group capable of reacting with the cross-linkable functional group contained in the main chain. Examples of the functional group capable of reacting with the cross-linkable functional group of the main chain may include, but are not limited to, an isocyanate group, an epoxy group, and the like.

The UV curable compound includes a functional group capable of reacting with a hydroxyl group contained in the main chain, and examples thereof may include, but are not limited thereto, one or more kinds of (meth)acryloyloxy isocyanate, (meth)acryloyloxy methyl isocyanate, 2-(meth)acryloyloxy ethyl isocyanate, 3-(meth)acryloyloxy propyl isocyanate, 4-(meth)acryloyloxy butyl isocyanate, m-propenyl-α,α-dimethyl benzyl isocyanate, methacryloyl isocyanate, or allyl isocyanate; an acryloyl monoisocyanate compound obtained by reacting a diisocyanate compound or a polyisocyanate compound with 2-hydroxyethyl (meth)acrylate; an acryloyl monoisocyanate compound obtained by reacting a diisocyanate compound or a polyisocyanate compound, a polyol compound, and 2-hydroxyethyl (meth)acrylate; and glycidyl (meth)acrylate or allyl glycidyl ether containing a functional group capable of reacting with a carboxyl group contained in the main chain.

The UV curable compound may be included in the side chain of the base resin by substituting 5 mol % to 90 mol % of the cross-linkable functional group contained in the main chain. When the substitution amount is less than 5 mol %, peel strength may not be sufficiently lowered by ultraviolet irradiation. When the substitution amount is more than 90 mol %, cohesiveness of the adhesive before ultraviolet irradiation may be decreased.

The tacky layer may suitably include a tackifier such as a rosin resin, a terpene resin, a phenol resin, a styrene resin, an aliphatic petroleum resin, an aromatic petroleum resin, an aliphatic aromatic copolymer petroleum resin, and the like.

A method of forming the tacky layer on a base film is not specifically limited, and for example, a method of directly coating an adhesive composition on a base film to form a tacky layer, or a method of firstly coating an adhesive composition on a peelable base to prepare a tacky layer, and then transcribing the adhesive layer to a base film using a peelable base, may be used.

Herein, the methods of coating and drying the adhesive composition are not specifically limited, and for example, a method of coating the composition including the above components as it is, or diluting it in an appropriate organic solvent and coating by known means such as a comma coater, a gravure coater, a die coater, a reverse coater, and the like, and then drying the solvent at a temperature of 60° C. to 200° C. for 10 s to 30 min, may be used. Further, in the above process, an aging process may be further conducted so as to progress sufficient cross-linking of the adhesive.

The tacky layer may have a thickness of 1 μm to 100 μm.

In addition, the back grinding tape of the embodiment may further include a light-transmitting substrate having a thickness of from 5 μm to 200 μm.

The light-transmitting substrate may be a substrate including a polymer resin having transmittance of 50% or more with respect to a wavelength of 300 to 600 nm.

The type of the polymer resin usable as the light-transmitting substrate is not particularly limited. Examples of the material of the light-transmitting substrate may include polyester such as PET, cellulose such as triacetyl cellulose, cyclic olefin-based (co)polymer, polyimide, styrene acrylonitrile copolymer (SAN), low density polyethylene, linear polyethylene, medium density polyethylene, high density polyethylene, ultra low density polyethylene, a random copolymer of polypropylene, a block copolymer of polypropylene, homopolypropylene, polymethylpentene, ethylene-vinyl acetate copolymer, an ethylene-methacrylic acid copolymer, an ethylene-methyl methacrylate copolymer, an ethylene-ionomer copolymer, an ethylene-vinyl alcohol copolymer, polybutene, a copolymer of styrene, and a mixture of two or more thereof.

Specifically, the back grinding tape of the embodiment may have a structure in which an adhesive layer is formed on one surface of the polymer resin layer, or a structure in which the polymer resin layer is formed on one surface of the light-transmitting substrate and the tacky layer is formed on the other surface of substrate.

Meanwhile, the back grinding tape may further include an adhesive layer, if necessary.

The adhesive layer may include a thermoplastic resin, an epoxy resin, and a curing agent.

The thermoplastic resin may include at least one polymer resin selected from the group consisting of polyimide, polyether imide, polyester imide, polyamide, polyether sulfone, polyether ketone, polyolefin, polyvinyl chloride, phenoxy, reactive butadiene acrylonitrile copolymer rubber, and a (meth)acrylate-based resin.

As the epoxy resin, an epoxy resin for general adhesive known in the art may be used. For example, an epoxy resin containing two or more epoxy groups in the molecule and having a weight average molecular weight of 100 to 2000, may be used.

The epoxy resin forms a hard cross-linked structure by a curing process, and may exhibit excellent adhesiveness, heat resistance, and mechanical strength. More specifically, the epoxy resin may have an average epoxy equivalent weight of 100 to 1000. When the epoxy equivalent weight of the epoxy resin is less than 100, cross-linking density becomes too high, and the adhesive film may exhibit overall rigid properties. When the epoxy equivalent weight is more than 1000, heat resistance may be lowered.

Examples of the epoxy resin may include, but are not limited to, one or more kinds of a bifunctional epoxy resin such as a bisphenol A epoxy resin and a bisphenol F epoxy resin; and a polyfunctional epoxy resin having three or more functional groups such as a cresol novolac epoxy resin, a phenol novolac epoxy resin, a tetrafunctional epoxy resin, a biphenyl-type epoxy resin, a triphenol methane-type epoxy resin, an alkyl modified triphenol methane-type epoxy resin, a naphthalene-type epoxy resin, a dicyclopentadiene-type epoxy resin, and a dicyclopentadiene-modified phenol-type epoxy resin.

It is preferable to use a mixed resin of the bifunctional epoxy resin and the polyfunctional epoxy resin as the epoxy resin. In this disclosure, the term "polyfunctional epoxy resin" refers to an epoxy resin having three or more functional groups. That is, in general, the bifunctional epoxy resin is excellent in flexibility and flowability at a high temperature, but has poor heat resistance and a low curing rate. On the other hand, the polyfunctional epoxy resin having three or more functional groups has a high curing rate and exhibits excellent heat resistance due to high cross-linking density, but has poor flexibility and flowability.

The curing agent contained in the adhesive layer is not particularly limited as long as it reacts with the epoxy resin and/or the thermoplastic resin to form a cross-linked structure. For example, the curing agent may include at least one compound selected from the group consisting of a phenol-based resin, an amine-based curing agent, and an acid anhydride-based curing agent.

The adhesive layer may include 10 to 1000 parts by weight of the thermoplastic resin and 10 to 700 parts by weight of the curing agent based on 100 parts by weight of the epoxy resin.

The curing catalyst functions for facilitating the action of the curing agent or the curing of the adhesive resin composition for bonding semiconductors, and any curing catalysts known to be used in the field of the adhesive film for semiconductors may be applied without particular limitations. For example, as the curing catalyst, at least one selected from the group consisting of a phosphorus-based compound, a boron-based compound, a phosphorous-boron-based compound, and an imidazole-based compound may be used. The amount of the curing catalyst may be appropriately selected considering properties of the finally produced adhesive film, and the like. For example, 0.5 to 10 parts by weight of the curing catalyst may be used based on 100 parts by weight of a total amount of the epoxy resin, the (meth) acrylate-based resin, and the phenol resin.

The adhesive layer may have a thickness of 1 μm to 300 μm.

According to another embodiment of the present disclosure, a method of grinding a wafer using the back grinding tape is provided.

After the back grinding tape is adhered to one surface of the semiconductor wafer, a grinding process of the semiconductor wafer may proceed. After the grinding process, the back grinding tape may be peeled off after UV irradiation or heat treatment.

The method of using the back grinding tape in the grinding process of a semiconductor wafer is not particularly limited. For example, the back grinding tape may be attached to a circuit surface half-cut to a thickness of 50 μm at room temperature, and then the back grinding tape attached surface may be fixed to a vacuum table to grind the back surface of the circuit surface. Subsequently, the back grinding tape may be removed from the ground wafer by irradiating UV A at 500 mJ/cm$^2$ or more.

ADVANTAGEOUS EFFECTS

According to the present disclosure, a back grinding tape which can be easily applied to a grinding process of a wafer having a thin thickness and can exhibit improved wafer protecting performance, and a grinding method of a wafer using the back grinding tape, are provided.

The present invention will be described in more detail in the following examples. However, these examples are for illustrative purposes only, and the invention is not intended to be limited by these examples.

EXAMPLE 1

Preparation of Back Grinding Tape (1) Preparation of Polymer Resin Layer 25 g of polycarbonate urethane acrylate (molecular weight: 30,000 g/mol), 30 g of 2-ethylhexyl acrylate (2-EHA), 15 g of 2-hydroxyethyl acrylate (2-HEA), 15 g of o-phenyl phenoxy ethyl acrylate (OPPEA, glass transition temperature: 33° C.) and 15 g of isobornyl acrylate (IBOA, glass transition temperature: 94° C.) were placed and mixed.

0.5 g of a photoinitiator (Irgacure 651) was added and mixed based on 100 parts by weight of the monomers. The mixture containing the photoinitiator was directly coated on a PET substrate (manufactured by SKC, T7650 grade) having a thickness of 50 μm and irradiated with a UV dose of 1 J/cm$^2$ to prepare a semi-finished product having a thickness of 100 μm including a polymer resin layer having a thickness of 50 μm.

The glass transition temperature of the polymer resin layer was confirmed to be −10° C., which was measured by a dynamic mechanical analyzer Q-800 (manufactured by TA Instruments).

(2) Preparation of Tacky Layer 7 g of a TDI-based isocyanate curing agent and 3 g of a photoinitiator (Irgacure 184) were mixed with 100 g of a (meth)acrylate-based polymer resin copolymerized from a mixture of 68.5 parts by weight of 2-ethylhexyl acrylate (2-EHA), 8.5 parts by weight of methyl acrylate (MA), and 23 parts by weight of hydroxyethyl acrylate (HEA) to prepare an adhesive composition.

The adhesive composition was coated on a silicone release PET film, and then dried at 110° C. for 3 minutes to form a tacky layer having a thickness of 20 μm. The tacky layer having a thickness of 20 μm was laminated on the PET substrate of the semi-finished product including the polymer resin layer and the PET substrate (manufactured by SKC, T7650 grade) to prepare a back grinding tape.

Comparative Example 1

Preparation of Back Grinding Tape (1) Preparation of Polymer Resin Layer

A semi-finished product including a polymer resin layer was prepared in the same manner as in Example 1, except that 25 g of polycarbonate urethane acrylate (molecular weight: 30,000 g/mol), 10 g of 2-ethylhexyl acrylate (2-EHA), 15 g of 2-hydroxyethyl acrylate (2-HEA), 17 g of o-phenyl phenoxy ethyl acrylate (OPPEA), and 33 g of isobornyl acrylate (IBOA) were mixed.

The glass transition temperature of the polymer resin layer was confirmed to be 22° C., which was measured by a dynamic mechanical analyzer Q-800 (manufactured by TA Instruments).

(2) Preparation of Tacky Layer

A tacky layer having a thickness of 20 μm was formed on the semi-finished product in the same manner as in Example 1 above.

Experimental Example

Measurement of Recovery Rate

The recovery rates of the back grinding tapes prepared in the above example and comparative example were measured by the following methods, and the results are shown in Table 1 below.

(1) Samples having a width of 2.5 cm and a length of 25 cm were prepared for the back grinding tapes of Example 1 and Comparative Example 1.

(2) 2.5 cm of each end of the sample was fixed on a measuring instrument, and then stretched 5% with a tension mode using a texture analyzer in MD and TD directions at room temperature. A length stretched and a length recovered after holding for 1 minute were measured.

The recovery rate was measured as a percentage of the length recovered to the length stretched.

The recovery rate (%)=(length recovered/length stretched)*100

TABLE 1

|  | Example 1 | Comparative Example 1 |
|---|---|---|
| Recovery rate in MD direction (%) | 80 | 85 |
| Recovery rate in TD direction (%) | 75 | 70 |
| Difference between the recovery rates in MD/TD directions (%) | 5% | 15% |

Referring to Table 1, the back grinding tape of Example 1 had a difference between the recovery rate (%) in the MD direction and the recovery rate (%) in the TD direction of 5%. That is, it was confirmed that the back grinding tape had a difference between the recovery rates of less than a certain level, so that there was little deformation due to expansion or contraction, and no kerf shrinkage occurred during the back grinding process.

On the other hand, it was confirmed that the back grinding tape of Comparative Example 1 had a difference between the recovery rate (%) in the MD direction and the recovery rate (%) in the TD direction of 15%, so that kerf shrinkage occurred during the back grinding process.

The invention claimed is:

1. A back grinding tape, comprising a polymer resin layer comprising a urethane (meth)acrylate resin containing 10 to 40 wt % of a repeating unit derived from a (meth)acrylate monomer or oligomer having a glass transition temperature of 0° C. to 100° C.,
    wherein the polymer resin layer has a glass transition temperature of −30° C. to 0° C.,
    wherein the back grinding tape has an absolute value of a difference between a recovery rate 1 and a recovery rate 2 of 10% or less, and
    wherein the recovery rate 1 is a percentage ratio of a length recovered to a length stretched 5% in a first direction at room temperature,
    the recovery rate 2 is a percentage ratio of a length recovered to a length stretched 5% in a second direction perpendicular to the first direction, and
    the length recovered is measured after leaving the stretched back grinding film for one minute at room temperature.

2. The back grinding tape according to claim 1, wherein the (meth)acrylate monomer or oligomer having a glass transition temperature of at least 0° C. comprises at least one compound selected from o-phenyl phenoxyethyl acrylate, isobornyl (meth)acrylate, methyl acrylate, and cyclohexyl (meth)acrylate.

3. The back grinding tape according to claim 1, wherein the urethane (meth)acrylate resin further comprises a (meth)acrylate-based repeating unit containing a C2 to C12 alkyl group or a (meth)acrylate-based repeating unit containing a cross-linkable functional group.

4. The back grinding tape according to claim 1, wherein the absolute value of a difference between the recovery rate 1 and the recovery rate 2 of the back grinding tape is 5% or less.

5. The back grinding tape according to claim 1, wherein the first direction is a machine direction of the polymer resin layer included in the back grinding tape, and the second direction is a transverse direction of the polymer resin layer.

6. The back grinding tape according to claim 1, wherein the polymer resin layer has a thickness of 5 μm to 200 μm.

7. The back grinding tape according to claim 1, further comprising a tacky layer comprising a tacky resin and having a thickness of 1 μm to 100 μm.

8. The back grinding tape according to claim 7, further comprising a light-transmitting substrate having a thickness of from 5 μm to 200 μM.

9. The back grinding tape according to claim 8, wherein the polymer resin layer is formed on one surface of the light-transmitting substrate and the tacky layer is formed on the other surface of the light-transmitting substrate.

10. The back grinding tape according to claim 7, wherein the tacky resin includes a copolymer of a (meth)acrylic acid ester-based monomer or a monomer containing a cross-linkable functional group.

11. The back grinding tape according to claim 1, further comprising a light-transmitting substrate having a thickness of from 5 μm to 200 μm.

12. A method of grinding a wafer comprising attaching the back grinding tape of claim 1 to one surface of the wafer and performing grinding of the wafer, wherein the wafer has a thickness of 50 μm or less.

* * * * *